US006759249B2

(12) United States Patent
Zhuang et al.

(10) Patent No.: US 6,759,249 B2
(45) Date of Patent: *Jul. 6, 2004

(54) DEVICE AND METHOD FOR REVERSIBLE RESISTANCE CHANGE INDUCED BY ELECTRIC PULSES IN NON-CRYSTALLINE PEROVSKITE UNIPOLAR PROGRAMMABLE MEMORY

(75) Inventors: Wei-Wei Zhuang, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 185 days.

This patent is subject to a terminal disclaimer.

(21) Appl. No.: 10/072,225

(22) Filed: Feb. 7, 2002

(65) Prior Publication Data

US 2003/0148545 A1 Aug. 7, 2003

(51) Int. Cl.⁷ .......................... H01L 21/00; G11C 11/22; G11C 27/00
(52) U.S. Cl. .............................. 438/3; 365/46; 365/145; 365/148
(58) Field of Search ............................ 438/3, 381, 382, 438/384, 385; 365/45, 46, 145, 148

(56) References Cited

U.S. PATENT DOCUMENTS

| | | | |
|---|---|---|---|
| 6,204,139 B1 | | 3/2001 | Liu et al. |
| 6,431,371 B1 | * | 8/2002 | Tonon ........................... 211/50 |
| 6,569,745 B2 | * | 5/2003 | Hsu .............................. 438/385 |
| 6,606,261 B2 | * | 8/2003 | Gudesen et al. ............. 365/145 |
| 2002/0027794 A1 | * | 3/2002 | Gudesen et al. ............. 365/117 |
| 2003/0001178 A1 | * | 1/2003 | Hsu et al. ..................... 257/296 |
| 2003/0003674 A1 | * | 1/2003 | Hsu et al. ..................... 438/385 |
| 2003/0003675 A1 | * | 1/2003 | Hsu ............................. 438/385 |
| 2003/0142578 A1 | * | 7/2003 | Hsu et al. ..................... 365/238 |
| 2003/0148545 A1 | * | 8/2003 | Zhuang et al. .................. 438/3 |
| 2003/0148546 A1 | * | 8/2003 | Zhuang et al. .................. 438/3 |
| 2003/0156445 A1 | * | 8/2003 | Zhuang et al. ............... 365/148 |

OTHER PUBLICATIONS

Liu et al., *Electric–pulse–induced reversible resistance change effect in magnetoresistive films*, Applied Physics Letters, vol. 76, No. 19; May 8, 2000, pp 2749–2751.

* cited by examiner

*Primary Examiner*—Evan Pert
(74) *Attorney, Agent, or Firm*—David C. Ripma; Matthew D. Rabdau

(57) ABSTRACT

A method of fabricating a variable resistance device, wherein the resistance is changed by passing a voltage of various pulse length through the device, includes preparing a silicon substrate; forming a silicon oxide layer on the substrate; depositing a first metal layer on the silicon oxide, wherein the metal of the first metal layer is taken from the group of metals consisting of platinum and iridium; depositing a perovskite metal oxide thin film on the first metal layer; depositing a second metal layer on the perovskite metal oxide, wherein the metal of the second metal layer is taken from the group of metals consisting of platinum and iridium; annealing the structure at a temperature of between about 400° C. to 700° C. for between about five minutes and three hours; and completing the variable resistance device. A variable resistance R-RAM device includes a silicon substrate having a silicon oxide layer thereon; a first metal layer formed on the silicon oxide layer, wherein the metal of the first metal layer is taken from the group of metals consisting of platinum and iridium; a perovskite metal oxide thin film layer formed on the first metal layer; a second metal layer formed on the perovskite metal oxide, wherein the metal of the second metal layer is taken from the group of metals consisting of platinum and iridium; and metallizing elements to provide a complete device.

29 Claims, 3 Drawing Sheets

DEVICE AND METHOD FOR REVERSIBLE RESISTANCE CHANGE INDUCED BY ELECTRIC PULSES IN NON-CRYSTALLINE PEROVSKITE UNIPOLAR PROGRAMMABLE MEMORY

FIELD OF THE INVENTION

This invention relates to a method of inducing a reversible resistance change by applying electric pulses, in which the character of the resistance change, i.e., increase or decrease, is determined by the pulse duration time, and fabrication of a memory device incorporating the method of the invention.

BACKGROUND OF THE INVENTION

Perovskite metal oxide thin films, such as $Pr_{0.3}Ca_{0.7}MnO_3$ (PCMO), exhibit reversible resistance change when an electric pulse is applied. A PCMO thin film has been grown on both epitaxial $YBa_2Cu_3O_7$ (YBCO) and partial epitaxial Pt substrates via pulsed laser abrasion (PLA) technique, Liu et al., Electric-pulse-induced reversible resistance change effect in magnetoresistive films, Applied Physics Letters, 76, 2749, 2000; and Liu et al., U.S. Pat. No. 6,204,139, granted Mar. 20, 2001, for Method of switching the properties of perovskite materials used in thin film resistors. X-Ray diffraction (XRD) polar figures confirm the epitaxial properties of PCMO thin films.

U.S. Pat. No. 6,204,139 describes the resistance change which occurred when electric pulses are applied at room temperature to PCMO thin films. The PCMO thin films were deposited on both epitaxial $YBa_2Cu_3O_7$ (YBCO) and partial epitaxial Pt substrates by pulsed laser deposition (PLD). The polarity of the electric pulse determines the character of the resistance change, i.e., increase or decrease.

An electrically programmable resistance, non-volatile memory device, operable at room temperature, was made of PCMO epitaxially grown on YBCO on $LaAlO_3$, as published by Liu et al. This type of memory may be reversibly programmed by a reversed short electrical pulse. The memory cell is able to produce either single bit or multi-bit information. However, the PCMO must be in crystalline form, which requires that the PCMO must be grown on a specific bottom electrode, such as YBCO, which is not compatible to the stare-of-the-art silicon integrated circuit technology. The growth, or crystallization, temperature is relatively high, e.g., >700° C., which makes integration of the device into state-of-the-art integrated circuit very complex. In addition it is not possible to cover the fill circuit area with a single grain of PCMO. As the properties of a memory cell which is fabricated on a single grain PCMO crystal and the properties of a memory cell which is fabricated on a multi-grain PCMO crystal, which covers the grain boundary area, are not the same, circuit yield and memory performance problems will occur.

SUMMARY OF THE INVENTION

A method of fabricating a variable resistance device, wherein the resistance is changed by passing a voltage of various pulse lengths through the device, includes preparing a silicon substrate; forming a silicon oxide layer on the substrate; depositing a first metal layer on the silicon oxide, wherein the metal of the first metal layer is taken from the group of metals consisting of platinum and iridium; depositing a perovskite metal oxide thin film on the first metal layer; depositing a second metal layer on the perovskite metal oxide, wherein the metal of the second metal layer is taken from the group of metals consisting of platinum and iridium; annealing the structure at a temperature of between about 400° C. to 550° C. for between about ten minutes and three hours; and completing the variable resistance device.

A variable resistance R-RAM device includes a silicon substrate having a silicon oxide layer thereon; a first metal layer formed on the silicon oxide layer, wherein the metal of the first metal layer is taken from the group of metals consisting of platinum and iridium; a perovskite metal oxide thin film layer formed on the first metal layer; a second metal layer formed on the perovskite metal oxide, wherein the metal of the second metal layer is taken from the group of metals consisting of platinum and iridium; and metallizing elements to provide a complete device.

It is an object of the invention to provide a method of making a resistance change in an R-RAM device with a single polarity pulse.

Another object of the invention to provide a method of making a resistance change in an R-RAM device by varying the length of resistance-change-producing pulse.

A further object of the invention is to provide an R-RAM device which includes fabricating a PCMO layer on a metal layer.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

The method of the invention includes forming a PCMO metal oxide thin film on a substrate by spin-coating. PCMO thin films are polycrystalline and exhibit large reversible resistance changes when an electric pulse is applied.

The PCMO thin film of the method of the invention is deposited on a platinum or iridium layer which is in turn deposited on a silicon substrate, by a spin-coating process. A low temperature annealing process renders the PCMO thin film in a basic amorphous or polycrystalline structure. The resistance change is achieved by applying an electric pulse, and the character of the resistance change, i.e., increase or decrease, depends on the duration time of electric pulse. The range of the resistance change is quite large, from as low as 400 Ω to as high as 250 kΩ.

The method of the invention includes fabricating a memory resistor on an amorphous or on a very small grain PCMO thin film. Because the PCMO is in an amorphous form, it does not require a very high temperature treatment, and may be formed on a device bottom electrode, such as are used in state-of-the-art silicon integrated circuit processes. In addition, the amorphous PCMO material may be uniformly deposited over the full silicon wafer or in a nanoscale patterned area. These properties are essential for the method of the invention to be useful in very large scale memory chip and embedded memory integration applications.

Figure 1:
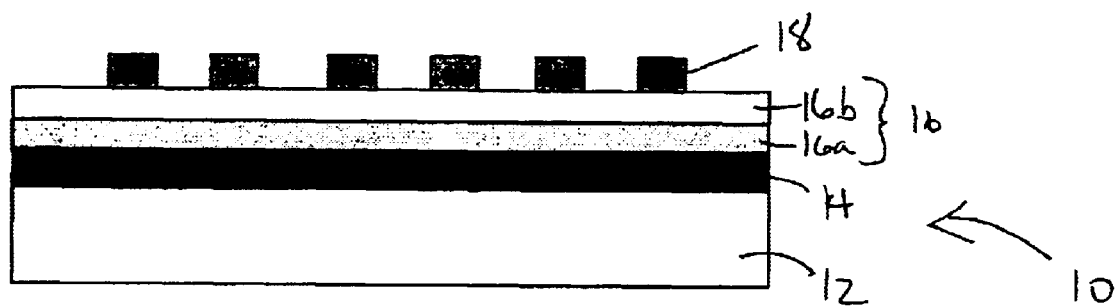
FIG. 1 depicts a memory resistor constructed according to the method of the invention.

Referring now to FIG. 1, the memory cell 10 of the invention is fabricated on a silicon substrate 12, which may be a bulk silicon or SIMOX substrate, and which has an oxide layer on the upper surface thereof. A layer of platinum 14 is deposited on the silicon substrate, and, in the preferred embodiment, is un-patterned. Layer 14 is deposited to a thickness of between about 100 nm to 200 nm by electron beam deposition, or other suitable deposition techniques. Multiple layers of PCMO are spin coated onto platinum layer 14 to a desired thickness, which, in the preferred embodiment, is between about 100 nm to 300 nm. After each layer of PCMO film is spin coated, the structure is baked arid annealed for between about five minutes and twenty minutes prior to the next coating process. During the baking process, in an ambient atmosphere, the temperature is progressively stepped up from about 100° C. to about 250° C. For instance, the structure may be initially healed to about 120° C. for one minute, then heated to about 180° C. for about one minute, and then heated to about 240° C. for about one minute. The structure is then annealed in an oxygen atmosphere at a temperature of between about 400° C. to 700° C. for the remainder of the time. The structure is then cooled, and the next layer of PCMO filmed is formed by spin coating. Typically, three layers of PCMO are deposited, although, the desired thickness may require between two and five layers. After the final layer is coated and baked, the stack of the film is annealed at low temperature in the range of between about 400° C. to 700° C. for between about five minutes to three hours in an oxygen atmosphere.

After the low temperature processing steps, the PCMO film is no longer in a single crystal form. The processed film includes an amorphous layer 16b and may include nanometer size crystals in a bottom layer 16a. A top electrode 18 is fabricated of platinum, which is deposited through a shadow mask, resulting in platinum buttons on the upper surface of the device. Layer 18 is deposited to a thickness of between about 100 nm to 200 nm by electron beam deposition, or other suitable deposition techniques. Top platinum dots 18, PCMO layer 16 and bottom platinum layer 14 form a PCMO resistor. The R-RAM device of the invention may be used in various forms of integrated circuits or incorporated into other devices. The structure is completed by the usual insulating and metallization steps.

A number of metal oxide compositions may be used to fabricate the memory device of the invention according to the method of the invention. The R-RAM metal oxide composition has the general formula of $M'_x M''_{(1-x)} M_y O_z$, wherein:

M': is taken from the group consisting of La, Ce, Bi, Pr, Nd, Pm, Sm, Y, Sc, Yb, Lu, Gd;

M": is taken from the group consisting of Mg, Ca, Sr, Ba, Pb, Zn, Cd;

M: is taken from the group consisting of Mn, Ce, V, Fe, Co, Nb, Ta, Cr, Mo, W, Zr, Hf, Ni;

x: has a range of between 0 to 1;

y: has a range of between 0 to 2; and z: has a range of between 1 to 7.

The metal oxide thin film may be fabricated using any of several conventional techniques, including metal oxide sputtering, spin-coating and MOCVD, although spin-coating is the preferred technique. A voltage of 0.1 V is applied between top platinum electrode 18 and bottom platinum electrode 14 for current and resistance measurement. The resistance is defined as the voltage divided by the current: R=V/I.

Figure 2:
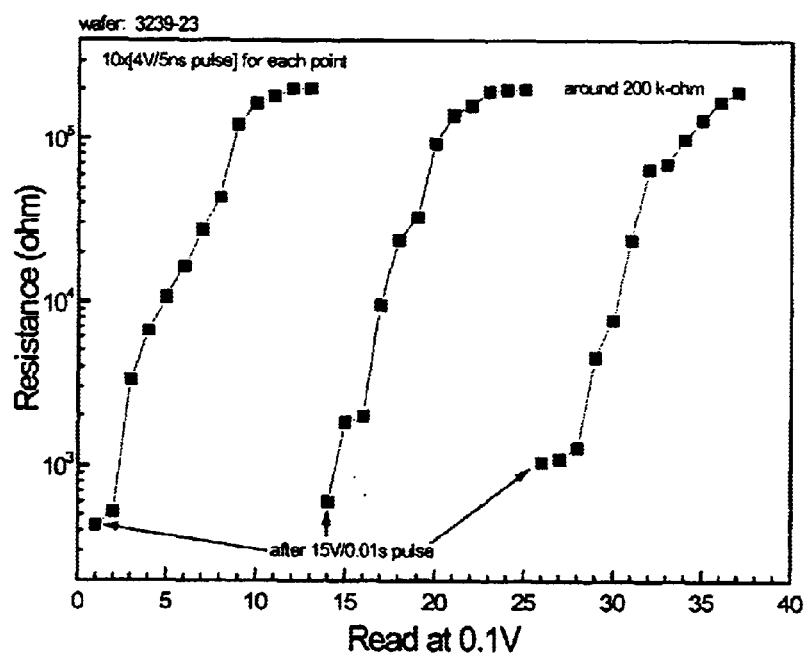
FIG. 2 is a graph of R v. pulse duration for a five nsec pulse.
Figure 3:
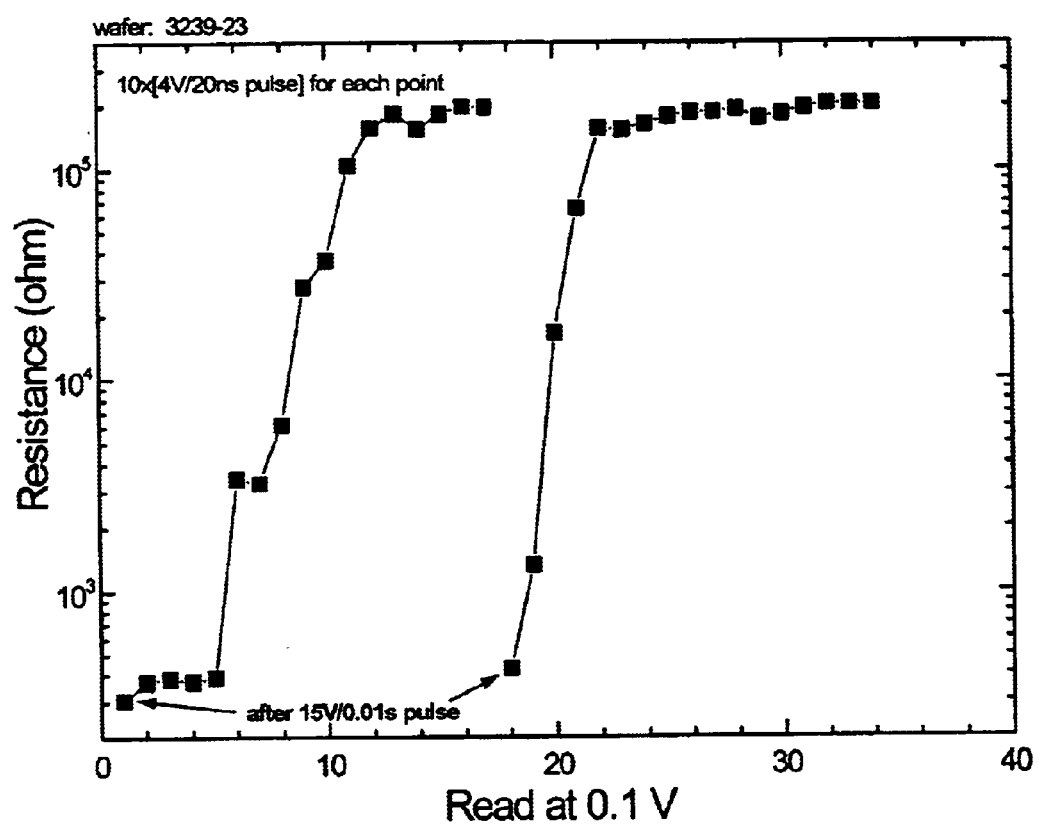
FIG. 3 is a graph of R v. pulse duration for a twenty nsec pulse.

The data depicted in FIGS. 2 and 3 was obtained from a R-RAM device fabricated according to the method of the invention, and specifically, a PCMO thin film was deposited on a silicon substrate having a non-partitioned platinum layer thereon by a spin-coating process. The thickness of the thin film was about 250 nm, as confirmed by SEM. The thin film composition was $Pr_{0.7}Ca_{0.3}MnO_3$. The resistance was measured on a HP-4145B semiconductor analyzer, and the electric pulse was generated from a pulse generator.

As shown in FIGS. 2 and 3, an electric pulse of short duration, e.g., 15 nsec to 1000 nsec, at between about two to five volts, with three volts being the preferred voltage, increases the resistance while an electric pulse of longer duration, e.g., 700 nsec to 1000 nsec, at between about one to three volts, with two volts being the preferred voltage, decreases the resistance. The pulse length and voltage are dependent on film thickness. The lowest measured resistance was about 400 Ω, and the highest measured resistance was about 250 kΩ. The resistance went up when the pulse duration was in a broad range of between about 3 nsec to 700 nsec, while the resistance went down when the pulse duration was in a broad range of between about 700 nsec to one second.

Figure 4:
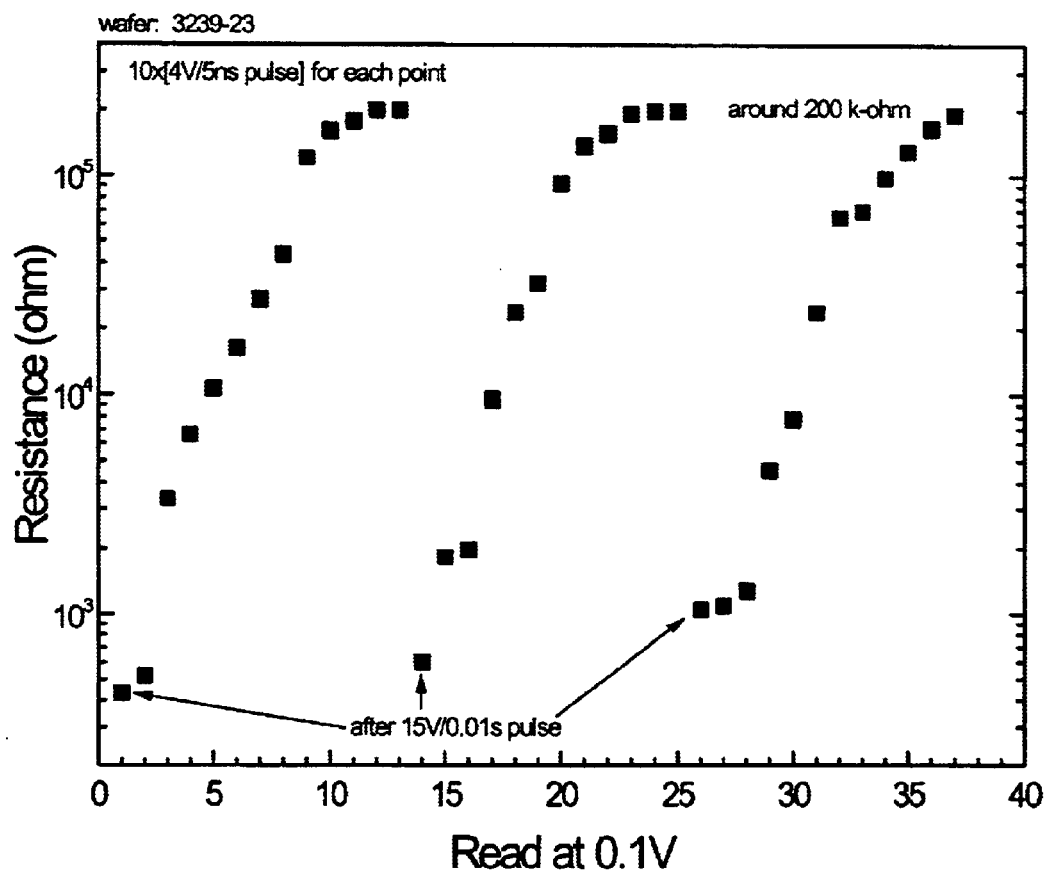
FIG. 4 is a graph of R v. number of pulse measurements.

FIG. 4 depicts the resistance of the memory resistor of FIG. 1 after each pulse is applied. The y-axis is the memory cell resistance and the x-axis is the number of the measurement. The amplitude of the pulse is indicated in FIG. 4. First, a wide pulse of pulse width 1 msec is applied. The resistance of the resistor is about 200 ohm. Next a series of 10 narrow, e.g., 5 nsec to 20 nsec, pulses are applied. The resistance of the resistor is measured and recorded after each series of pulses. The resistance of the resistor increases as the number of narrow pulses is increased. Finally the resistance saturated at about 200 kOhm. When a longer pulse is applied, the resistance of the resistor drops to about 200 ohm. The resistance of the resistor increases again when additional short pulses are applied. Thus the resistor may be programmed using electric pulses of short duration. A wide width pulse of the same amplitude may be used to reset the memory. The number of narrow pulses may control the resistor of the memory cell. The memory cell may also be used as multi-bit memory cell.

It is particularly interesting that the resistance increases following narrow pulses as well as decreases following wide pulses. Reset is independent of the polarity of the pulse. That is, regardless of whether a positive narrow pulse is applied or a negative narrow pulse is applied, the resistance of the memory resistor increases with the number of applied pulses, until the resistor reaches its high resistance state. The same is true for the wide pulse width reset process. Either of a positive wide pulse or a negative wide pulse may be used to re-set the memory resistor to its low resistance state. This feature enables the memory to be reset and programmed using single polarity pulses. No bi-polarity power supply is required.

Thus, a non-volatile resistor memory cell fabricated with amorphous PCMO has been disclosed. Amorphous PCMQ may be deposited by at low temperature. The thermal budget of amorphous PCMO is compatible with state-of-the-art ULSI integrated circuit processes as the electrode material is also commonly used in the state-of-the-art process. The memory device of the invention uses electrical pulses of the same polarity for memory programming and resetting changing only the pulse duration and number of pulses.

Therefore, the amorphous PCMO memory of the invention is suitable for use in embedded memory devices as well as in ultra large-scale memory chip fabrication. The method of the invention and the device of the invention is also applicable to colossal magnetoresistor (CMR), and high temperature super conductor (HTSC) material.

Thus, a method for reversible resistance change induced by electric pulses and a memory device incorporating the method of the invention has been disclosed. It will be appreciated that further variations and modifications thereof may be made within the scope of the invention as defined in the appended claims.

We claim:

1. A method of fabricating a variable resistance device comprising:

preparing a silicon substrate;

forming a silicon oxide layer on the substrate;

depositing a first metal layer on the silicon oxide, wherein the metal of the first metal layer is taken from the group of metals consisting of platinum and iridium;

depositing a perovakite metal oxide thin film on the first metal layer;

depositing a second metal layer on the perovskite metal oxide, wherein the metal of the second metal layer is taken from the group of metals consisting of platinum and iridium;

annealing the structure at a temperature of between about 400° C. to 700° C. for between about five minutes and three hours; and completing the variable resistance device.

2. The method of claim 1 wherein said depositing a perovskite metal oxide thin film includes depositing multiple layers of a perovskite metal oxide to a thickness of between about 100 nm to 300 nm, baking the structure between deposition of each layer at a temperature of between about 100° C. to 250° C. in an ambient atmosphere and annealing the structure at a temperature of between about 400° C. to 700° C. in an oxygen atmosphere for between about five minutes and twenty minutes.

3. The method of claim 2 which includes progressively stepping the temperature up from about 100° C. to about 250° C., including initially heating the structure to about 120° C. for one minute, then heating the structure to about 180° C. for about one minute, and then heating the structure to about 240° C. for about one minute.

4. The method of claim 1 wherein said depositing perovskite metal oxide thin film includes depositing a thin film which has a general formula of $M'_xM''_{(1-x)}M_yO_z$, wherein:

M': is taken from the group consisting of La, Ce, Bi, Pr, Nd, Pm, Sm Y, Sc, Yb, Lu, Gd;

M'': is taken from the group consisting of Mg, Ca, Sr, Ba, Pb, Zn, Cd;

M: is taken from the group consisting of Mn, Ce, V, Fe, Co, Nb, Ta, Cr, Mo, W, Zr, Hf, Ni;

x: has a range of between 0 to 1;

y: has a range of between 0 to 2; and z: has a range of between 1 to 7.

5. The method of claim 1 which further includes changing the resistance of the completed device by varying the length of resistance-change-producing pulses.

6. The method of claim 5 wherein said changing tho resistance of the completed device includes decreasing the resistance of the device by applying a voltage of between about one to three volts between the first metal layer and the second metal layer for a period of greater than 700 nsec.

7. The method of claim 5 wherein said changing the resistance of the completed device includes increasing the resistance of the device by applying a voltage of between about two to five volts between the first metal layer and the second metal layer for a period of less than 1000 nsec.

8. The method of claim 1 wherein said depositing a first metal layer on the silicon oxide, and wherein said depositing a second metal layer on the perovskite metal oxide, includes depositing layers which have a thickness of between about 100 nm and 200 nm.

9. The method of claim 1 wherein said depositing a perovskite metal oxide thin film includes depositing a layer of amorphous perovskite metal oxide thin film.

10. A method of fabricating a variable resistance R-RAM device comprising:

preparing a silicon substrate having a silicon oxide layer on then surface thereof;

depositing a first metal layer on the silicon oxide, wherein the metal of the first metal layer is taken from the group of metals consisting of platinum and iridium;

depositing a perovskite metal oxide thin film on the first metal layer, including depositing multiple layers of a perovakite metal oxide to a thickness of between about 100 nm to 300 nm, and baking the structure between deposition of each layer at a temperature of between about 100° C. to 250° C. in an ambient atmosphere and annealing the structure at a temperature of between about 400° C. to 700° C. in an oxygen atmosphere for between about five minutes and twenty minutes;

depositing a second metal layer on the perovakite metal oxide, wherein the metal of the second metal layer is taken from the group of metals consisting of platinum and iridium;

annealing the structure at a temperature of between about 400° C. to 700° C. for between about five minutes and three hours in an oxygen atmosphere; and completing the variable resistance device.

11. The method of claim 10 which includes progressively stepping the temperature up from about 100° C. to about 250° C., including initially heating the structure to about 120° C. for one minute, then heating the structure to about 180° C. for about one minute, and then heating the structure to about 240° C. for about one minute.

12. The method of claim 10 wherein said depositing a perovakite metal oxide thin film includes depositing a thin film which has a general formula of $M'_xM''_{(1-x)}M_yO_z$, wherein:

M': is taken from the group consisting of La, Ce, Bi, Pr, Nd, Pm, Sm Y, Sc, Yb, Lu, Gd;

M'': is taken from the group consisting of Mg, Ca, Sr, Ba, Pb, Zn, Cd;

M: is taken from the group consisting of Mn, Ce, V, Fe, Co, Nb, Ta, Cr, Mo, W, Zr, Hf, Ni;

x: has a range of between 0 to 1;

y: has a range of between 0 to 2; and z: has a range of between 1 to 7.

13. The method of claim 10 which further includes changing the resistance of the completed R-RAM device by varying the length of resistance-change-producing pulse.

14. The method of claim 13 wherein said changing the resistance of the completed device includes decreasing the resistance of the device by applying a voltage of between about one to three volts between the first metal layer end the second metal layer for a period of greater than 700 nsec.

15. The method of claim 13 wherein said changing the resistance of the completed device includes increasing the resistance of the device by applying a voltage of between about two to five volts between the first metal layer and the second metal layer for a period of less than 1000 nsec.

16. The method of claim 10 wherein said depositing a first metal layer on the oxide, and wherein said depositing a second metal layer on the perovskite metal oxide, includes depositing layers having a thickness of between about 100 nm and 200 nm.

17. The method of claim 10 wherein said depositing a perovskite metal oxide thin film includes depositing a layer of amorphous perovskite metal oxide thin film, and wherein said baking changes a portion of the amorphous perovskite metal oxide thin film into a crystalline layer.

18. A method of fabricating a variable resistance R-RAM device comprising:

preparing a silicon substrate having a silicon oxide layer on the a surface thereof depositing a first metal layer on the silicon oxide, wherein the metal of the first metal layer is taken from the group of metals consisting of platinum and iridium;

depositing a perovskite metal oxide thin film on the first metal layer, including depositing multiple layers of a perovskite metal oxide to a thickness of between about 100 nm to 300 nm, and baking the structure between deposition of each layer at a temperature of between about 100° C. to 250° C. in an ambient atmosphere, which includes progressively stepping the temperature up from about 100° C. to about 250° C., including initially heating the structure to about 120° C. for one minute, then heating the structure to about 180° C. for about one minute, and then heating the structure to about 240° C. for about one minute, and annealing the structure at a temperature of between about 400° C. to 700° C. in an oxygen atmosphere, wherein the baking and annealing last for between about five minutes and twenty minutes;

wherein said depositing a perovskite metal oxide thin film includes depositing a layer of amorphous perovskite metal oxide thin film, and wherein said baking changes a portion of the amorphous perovskite metal oxide thin film into a crystalline layer;

depositing a second metal layer on the perovskite metal oxide, wherein the metal of the second metal layer is taken from the group of metals consisting of platinum and iridium;

annealing the structure at a temperature of between about 400° C. to 700° C. for between about five minutes and three hours in an oxygen atmosphere; and completing the variable resistance device.

19. The method of claim 18 wherein said depositing a perovskite metal oxide thin film includes depositing a thin film which has a general formula of $M'_xM''_{(1-x)}M_yO_z$, wherein:

M': is taken from the group consisting of La, Ce, Bi, Pr, Nd, Pm, Sm, Y, Sc, Yb, Lu, Gd;

M'': is taken from the group consisting of Mg, Ca, Sr, Ba, Pb, Zn, Cd;

M: is taken from the group consisting of Mn, Ce, V, Fe, Co, Nb, Ta, Cr, Mo, W, Zr, Hf, Ni;

x: has a range of between 0 to 1;

y: has a range of between 0 to 2; and z: has a range of between 1 to 7.

20. The method of claim 18 which farther includes changing the resistance of the completed R-RAM device by varying the length of resistance-change-producing pulses.

21. The method of claim 20 wherein said changing the resistance of the completed device includes decreasing the resistance of the device by applying a voltage of between about one to three volts between the first metal layer and the second metal layer for a period of greater than 700 nsec, and wherein said changing the resistance of the completed device includes increasing the resistance of the device by applying a voltage of between about two to five volts between the first metal layer and the second metal layer for a period of less than 1000 nsec.

22. The method of claim 18 wherein said depositing a first metal layer on the oxide, and wherein said depositing a second metal layer on the perovskite metal oxide, includes depositing layers having a thickness of between about 100 nm and 200 nm.

23. A variable resistance R-RAM device comprising:

a silicon substrate having a silicon oxide layer thereon a first metal layer formed on the silicon oxide layer, wherein the metal of the first metal layer is taken from the group of metals consisting of platinum and iridium;

a perovskite metal oxide thin film layer formed on the first metal layer;

a second metal layer formed on the perovskite metal oxide, wherein the metal of the second metal layer is taken from the group of metals consisting of platinum and iridium; and metallizing elements that form the variable resistance R-RAM device.

24. The device of claim 23 wherein said a perovskite metal oxide thin film has a general formula of $M'_xM''_{(1-x)}M_yO_x$, wherein:

M': is taken from the group consisting of La, Ce, Bi, Pr, Nd, Pm, Sm, Y, Sc, Yb, Lu, Gd;

M'': is taken from the group consisting of Mg, Ca, Sr, Ba, Pb, Zn, Cd;

M: is taken from the group consisting of Mn, Ce, V, Fe, Co, Nb, Ta, Cr, Mo, W, Zr, Hf, Ni;

x: has a range of between 0 to 1;

y: has a range of between 0 to 2; and z: has a range of between 1 to 7.

25. The device of claim 23 wherein the resistance of the R-RAM device is changed by changing by varying the length of resistance-change-producing pulses applied between the first metal layer and the second metal layer.

26. The device of claim 25 wherein the resistance of the R-RAM device is decreased by applying a voltage of between about one to three volts between the first metal layer and the second metal layer for a period of greater than 700 nsec.

27. The device of claim 25 wherein the resistance of the R-RAM device is increased by applying a voltage of about two to five volts between the first metal layer and the second metal layer for a period of less than 1000 nsec.

28. The device of claim 23 wherein said first metal layer and said second metal layer have a thickness of between about 100 nm and 200 nm.

29. The device of claim 23 wherein said perovakite metal oxide thin film includes a layer of amorphous perovskite metal oxide thin film.

* * * * *